United States Patent
Tsuura

(10) Patent No.: US 6,340,604 B1
(45) Date of Patent: Jan. 22, 2002

(54) CONTACTOR AND SEMICONDUCTOR DEVICE INSPECTING METHOD

(75) Inventor: Katsuhiko Tsuura, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/455,151

(22) Filed: Dec. 6, 1999

Related U.S. Application Data

(62) Division of application No. 08/963,141, filed on Nov. 3, 1997, now Pat. No. 6,040,706.

(30) Foreign Application Priority Data

Nov. 7, 1996 (JP) .............................................. 8-295077

(51) Int. Cl.⁷ .............................................. H01L 21/66
(52) U.S. Cl. .............................. 438/15; 438/14; 438/16; 324/754; 324/755
(58) Field of Search ............................... 438/14, 15, 16

(56) References Cited

U.S. PATENT DOCUMENTS

| | | | |
|---|---|---|---|
| 4,766,371 A | | 8/1988 | Moriya |
| 5,548,884 A | * | 8/1996 | Kim .............................. 29/593 |
| 5,559,444 A | | 9/1996 | Farnworth et al. |
| 5,865,632 A | | 2/1999 | Iwasaki |
| 6,040,706 A | * | 3/2000 | Tsuura ........................ 324/765 |
| 6,208,525 B1 | * | 3/2001 | Imasu et al. ................. 361/783 |

FOREIGN PATENT DOCUMENTS

| | | |
|---|---|---|
| JP | 4-262551 | 9/1992 |
| JP | 5-211219 | 8/1993 |

OTHER PUBLICATIONS

"Nitto Technical Report", vol. 28, No. 2, Oct. 1990, pp. 57–62.

* cited by examiner

*Primary Examiner*—John F. Niebling
*Assistant Examiner*—Olivia Luk
(74) *Attorney, Agent, or Firm*—Pearne & Gordon LLP

(57) ABSTRACT

Semiconductor chips 15 are separated from one another by cutting a semiconductor wafer along scribing lines, and are fitted in recesses 11 formed in a contactor 10. Bump electrodes 13 are brought into contact with the pad electrodes of the semiconductor chips, so that the former electrodes are electrically connected to the latter electrodes. Each of the recesses of the contactors are surround by side walls which are trapezoid in section. Hence, the side walls can be readily fitted in the grooves formed along the scribing lines; that is, the semiconductors 15 can be fitted in the recesses 11 with ease. The contactor 10 and the dicing sheet having the semiconductor chips 15 are pressed against each other, so that the electrode connection is positively achieved.

6 Claims, 6 Drawing Sheets

CONTACTOR AND SEMICONDUCTOR DEVICE INSPECTING METHOD

CROSS-REFERENCE TO RELATED APPLICATION

The present application is a division of U.S. application Ser. No. 08/963,141, filed Nov. 3, 1997 now U.S. Pat. No. 6,040,706.

BACKGROUND OF THE INVENTION

The present invention generally relates to a method and device for inspecting a plurality of semiconductor chip integrated circuits formed on a semiconductor wafer.

Recently, miniaturization of an electronic unit incorporating a semiconductor IC circuit device (hereinafter referred to as "a semiconductor device", when applicable) has been markedly advanced with reduction of the manufacturing cost thereof. Hence, there has been a strong demand for miniaturization of semiconductor device which is a main element in an electronic unit and for a reduction in the manufacturing cost thereof.

In general, in the step of installation in the manufacturing of a semiconductor device, a semiconductor chip is mounted on the die pad of a lead frame, and then the semiconductor chip is electrically connected to the lead frame with bonding wires. Thereafter, the semiconductor chip and the lead frame are sealed with resin or ceramics, and then mounted on a printed circuit board.

A sealing material such as resin or ceramics does not directly affect electrical circuit characteristics. Hence, in order to reduce the size and weight of an electronic unit, a method has been developed in which a semiconductor chip which is obtained by cutting a semiconductor wafer and is not sealed is directly mounted, as a semiconductor device, on a circuit board. In this methods it is essential that the semiconductor chip is guaranteed in quality.

In general, for guarantee in quality of a semiconductor device, before a delivery inspection is given to the semiconductor device, a burn-in test is carried out in which stress is applied to a semiconductor device to make its latent defect tangible, thereby to remove a semiconductor device which may become out of order. Heretofore, the following method is generally employed: After being sealed with resin or ceramics, semiconductor chips are mounted on a burn-in board having a plurality of sockets. Under this condition, a voltage is applied to the semiconductor devices which is higher than a voltage which is usually applied thereto, so that the semiconductor devices are operated at high temperature; that is, stress is applied to the semiconductor device.

In the case where it is required to give the burn-in test to semiconductor chips which are not sealed, the latter are mounted on a current applying substrate for reliability guarantee by using a semiconductor chip sockets. However, the semiconductor chip sockets are expensive, and the handling of the semiconductor chips are rather troublesome which are not sealed yet. This means that the test requires a relatively long time. In order to overcome this difficulty, a method has been developed in which, when the semiconductor chips are in the form of a semiconductor wafer, they are collectively subject to the burn-in test.

In an inspection by the burn-in test of this type, probe needles are electrically connected to a plurality of semiconductor chips formed on a single semiconductor wafer—for instance the probe needles are mounted on the semiconductor chips—under this condition, a supply voltage or signal is applied to the probe needles to operate the plurality of the semiconductor chips. Therefore, it is necessary to provide a probe card having a large number of probe needles, and the probe card is expensive. For instance, several probe needles to several tens of probe needle are required per device. Since each wafer has more than several hundred devices, it is necessary to provide a probe card having more than one thousand probe needles. In practice, it is considerably difficult to manufacture such a probe card.

In order to overcome this difficulty, a contactor which is a thin probe card, has been proposed in the art. The contactor comprises a flexible substrate having bump electrodes (cf. "Nitto Technical Report", vol. 28, No. 2 (October 1990, pp. 57–62).

A burn-in test using the aforementioned contactor will be described.

FIG. 12 is a fragmentary sectional view for a description of a probing operation using the contactor. In FIG. 12, reference numeral 1 designates a card type contactor; 2, a polyimide substrate; 3, a wiring layer formed on the polyimide substrate; 4, probe terminals, namely, bump electrodes; 5, through-holes through which the wiring layer 3 is connected to the bump electrodes 4; 6, a semiconductor wafer; and 7, pad electrodes.

As shown in FIG. 12, the contactor 1 is pressed against the semiconductor wafer 6 (to which a burn-in test is to be given) on a substrate to be measured, so that the pad electrodes 7 (or inspecting electrodes) of the semiconductor wafer 6 are positively connected to the bump electrodes 4 of the contactor 1. Under this condition, supply voltage or signal is applied through the wiring layer 3, to inspect the semiconductor wafer 6.

Heretofore, the positioning of the wafer and the contactor is carried out by using a reference position provided on the contactor and several alignment marks on the wafer. However, this positioning method is disadvantageous as follows: It is impossible to visually accurately detect whether or not the bump electrodes of the contactor are in alignment with the pad electrodes on the semiconductor wafer; that is, it is difficult to align the bump electrodes with the pad electrodes with high accuracy. In addition, after the alignment of the electrodes, the wafer and the contactor may be shifted from each other, for instance, by vibration.

In the prior art, in the burn-in test carried out at a high temperature (for instance 125° C.), it is necessary to maintain the semiconductor wafer at high temperature. When the semiconductor wafer is heated from room temperature (for instance 25° C.) to the high temperature (125° C.), the semiconductor wafer is expanded, and at the same time the contactor (made of a polyimide substrate) is also expanded. The thermal expansion coefficient of the silicon which is the material of the semiconductor wafer, is $3.5 \times 10^{-6}/°$ C., and the thermal expansion coefficient of the polyimide which the material of the contactor, is $16 \times 10^{-6}/°$ C. Hence, when the temperature is increased from room temperature (25° C.) to the high temperature (125° C.), a 8-inch semiconductor wafer (20.2 cm in diameter) is expanded 70 microns, while the contactor (polyimide substrate) is expanded 320 microns.

The size of the pad electrodes on the semiconductor wafer is 50 to 100 microns. Hence, because of the difference in expansion between the semiconductor wafer and the polyimide substrate, in the peripheral portion of the semiconductor wafer the pad electrodes are not electrically connected to the bump electrodes.

In other words, even if the pad electrodes of the semiconductor wafer are electrical in contact with the bump electrodes of the contactor at room temperature, as the temperature is increased, the following problem takes place: Because of the difference in thermal expansion coefficient between the semiconductor wafer and the contactor, in the peripheral portion of the semiconductor wafer the pad electrodes of the semiconductor wafer are shifted from the bump electrodes; that is, the former electrodes are not electrically connected to the latter electrodes.

SUMMARY OF THE INVENTION

An object of the invention is to eliminate the above-described difficulties accompanying the prior art. More specifically, an object of the invention is to provide a contactor and a semiconductor device inspecting method in which the bump electrodes of the contactor are accurately in alignment with the pad electrodes on a semiconductor wafer, and in which it is visually detect whether or not the bump electrodes of the contactor are connected to the pad electrodes on the semiconductor wafer, and those electrodes are prevented from being shifted by external causes.

Another object of the invention is provide a contactor and a semiconductor device inspecting method in which, even at high temperature, in the peripheral portion of a semiconductor wafer the pad electrodes of the latter are never shifted from the bump electrodes of the contactor; that is, the former electrodes are positively electrically connected to the latter electrodes.

The foregoing objects of the invention have been achieved by the provision of the following means:

A contactor according to an aspect of the invention comprise: a plurality of recesses which are substantially equal in size to semiconductor chips; side walls provided respectively around the recesses; and a plurality of bump electrodes formed in the recesses in correspondence to a plurality of pad electrodes formed on the semiconductor chips.

With the above-described means, the side walls are engaged with grooves which are formed when a semiconductor wafer is cut to form a plurality of semiconductor chips. That is, since the semiconductor chips are fitted in the recesses which are equal in size to the semiconductor chips, the positions of the pad electrodes on the semiconductor chips and those of the bump electrodes are automatically determined.

A contactor according to another aspect of the invention comprises: a plurality of recesses which are substantially equal in size to semiconductor chips; side walls provided respectively around the recesses; a plurality of bump electrodes formed in the recesses in correspondence to a plurality of pad electrodes formed on the semiconductor chips; a substrate to which a plurality of semiconductor chips are secured through an expandable dicing sheet; and means for press-fitting the semiconductor chips on the substrate into the recesses.

With the side walls engaged with the grooves, the semiconductor chips are fitted in the recesses, and the semiconductor chips are secured to the substrate through the dicing sheet. Under this condition, the semiconductor chips are press-fitted in the recesses, so that the bump electrodes of the contactor are positively connected to the pad electrodes of the semiconductor chips.

Furthermore, with the contactor, the side walls formed around the recesses are trapezoid in section.

Therefore, the width of the end of each of the side walls is smaller than the width of each of the grooves. This feature makes it possible to engage the side walls with the grooves with ease.

Moreover, according to the invention, the semiconductor wafer is secured to the expandable dicing sheet, and then cut into the semiconductor chips, and the side walls are engaged with the grooves which are formed when the semiconductor wafer is cut in the above-described manner. Hence, the bump electrodes in the recesses are in alignment with the pad electrodes of the semiconductor chips; that is; the former electrodes are electrically connected to the latter electrodes. Hence, even when the contactor is thermally expanded by the high temperature during the burn-in test, the semiconductor chips fitted in the recesses are moved according to the expansion of the contact with the aid of the expandable dicing sheet. Therefore, the bump electrode will never be shifted from the pad electrodes.

A delivery inspection is given to the semiconductor chips to which the burn-in test has been given. Therefore, only acceptable semiconductor chips are shipped out of the factory at all times.

Furthermore, the following method may be employed: That is, it is determined whether or not semiconductor chips are acceptable. If a semiconductor chip or chips which have been determined unacceptable, those chips are eliminated. Under this condition, the burn-in test is carried out. This will prevent the flow of abnormal current to the contactor which is due to the unacceptable semiconductor chip or chips. Hence, the contactor can be protected, and, in the burn-in test, stable voltage or current may be supplied.

BRIEF DESCRIPTION OF THE DRAWING(S)

Figure 4:
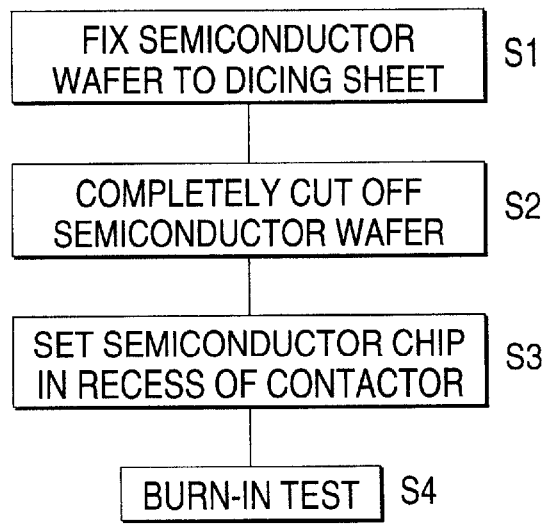
Figure 5:
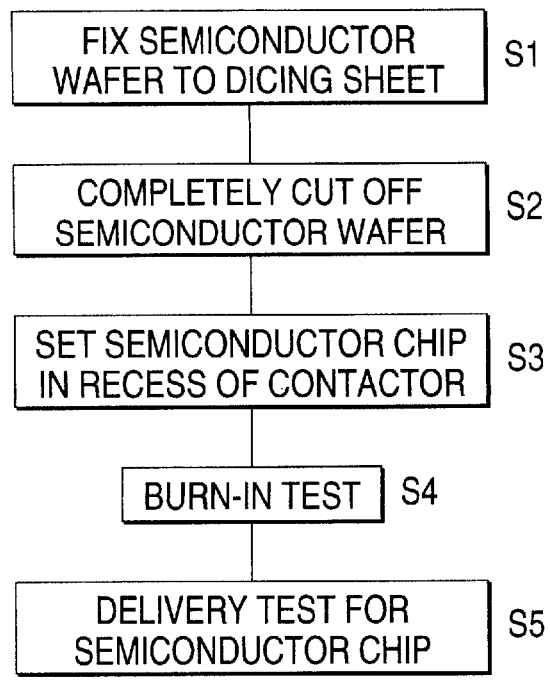
Figure 6:
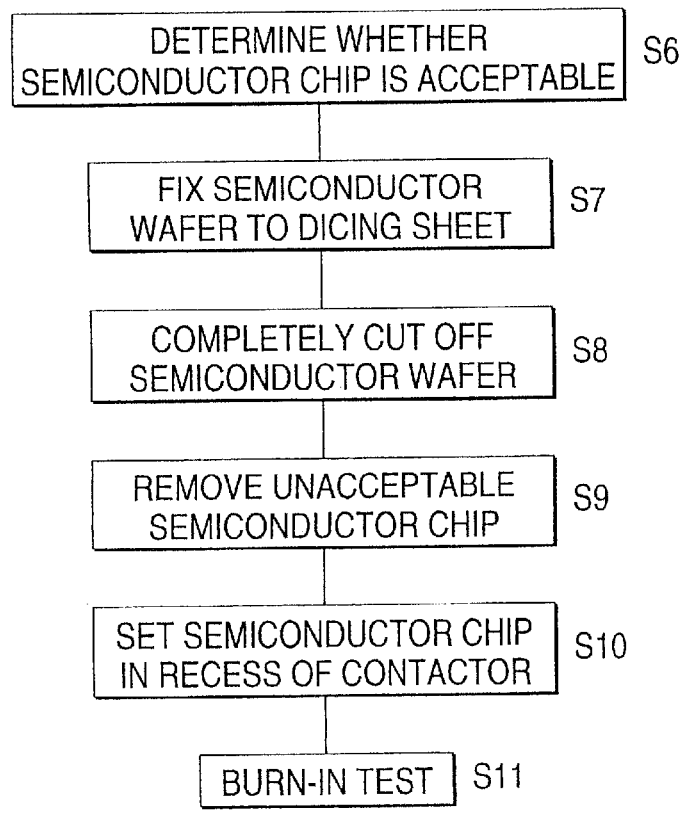
Figure 7:
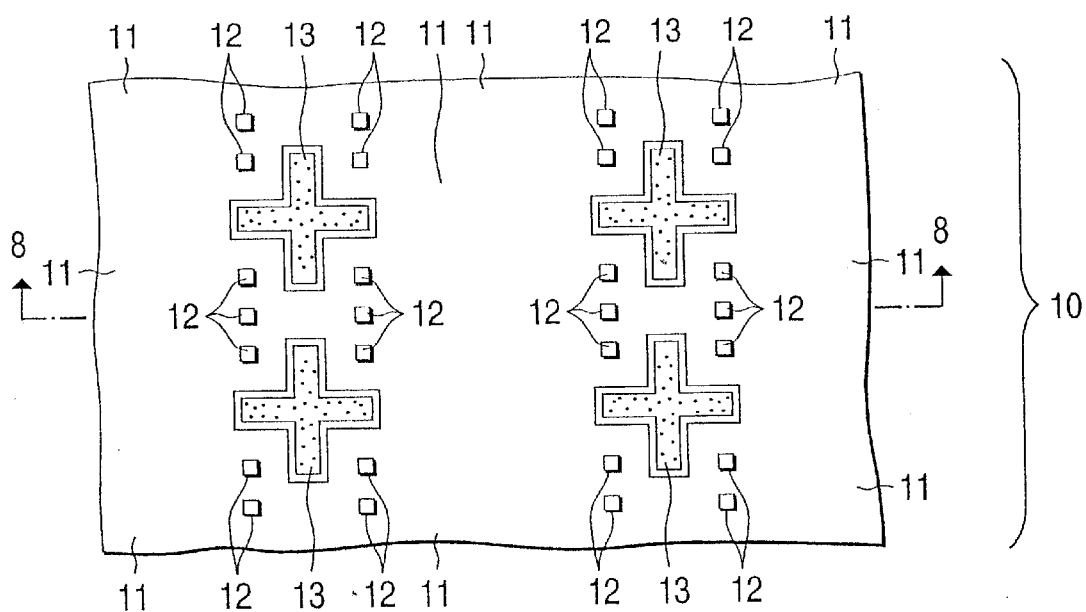
Figure 8:
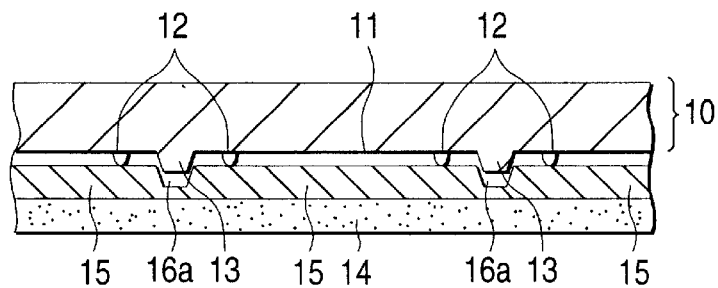
Figure 9:
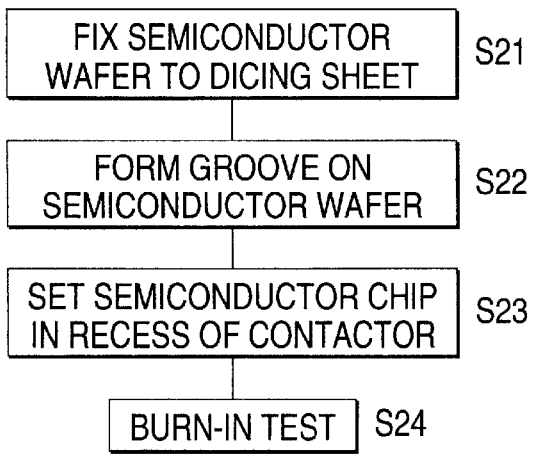
Figure 10:
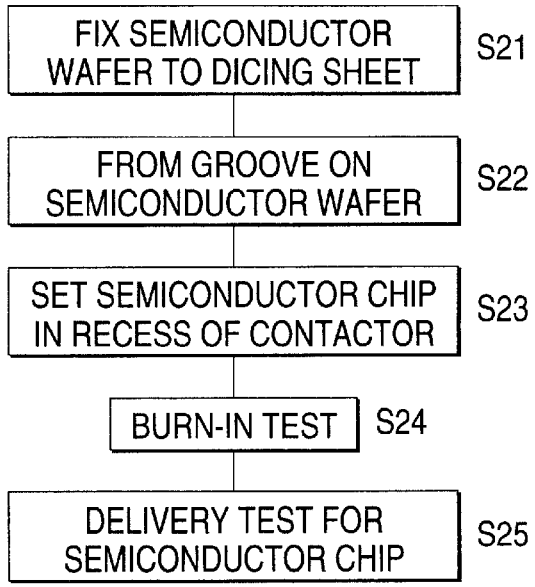
Figure 11:
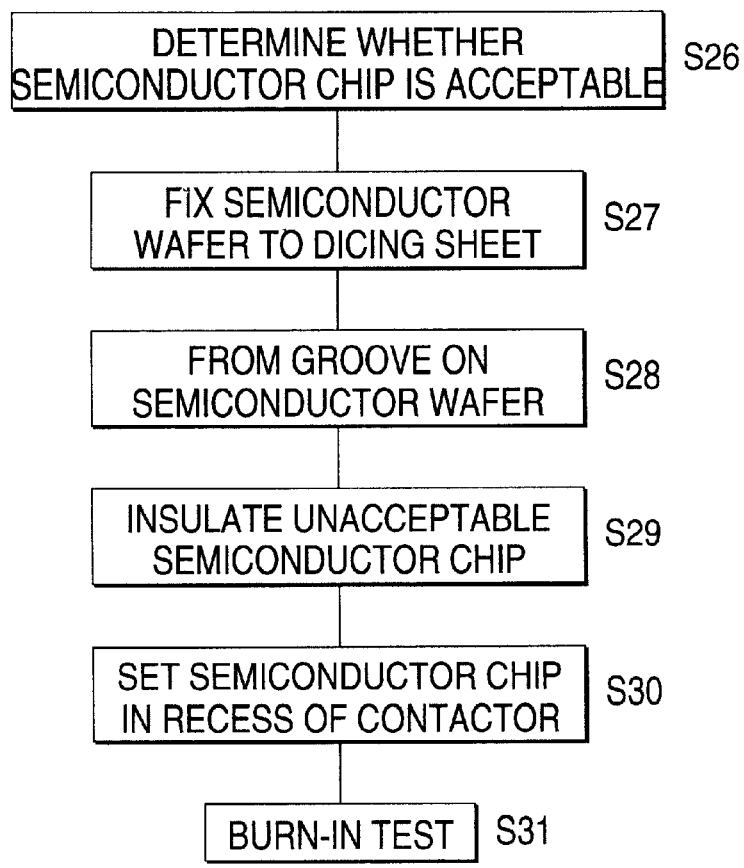
Figure 12:
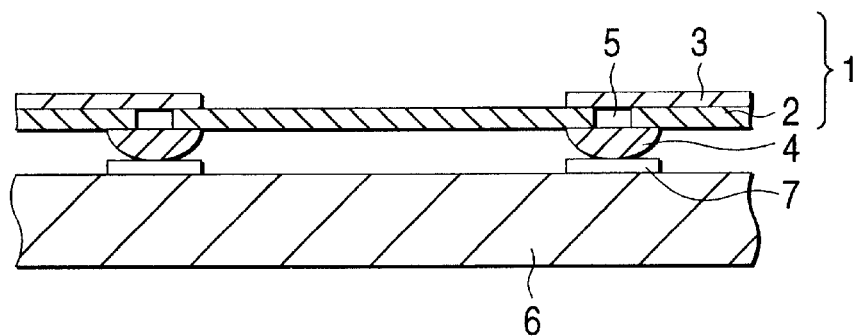

FIG. 4. is a flow chart for a description of a method of inspecting a semiconductor device according to a third embodiment of the invention;

FIG. 5 is a flow chart for a description of a method of inspecting a semiconductor device according to a fourth embodiment of the invention;

FIG. 6 is a flow chart for a description of a method of inspecting a semiconductor device according to a fifth embodiment of the invention;

FIG. 7 is a plan view showing a part of the contactor according to a tenth embodiment of the invention;

FIG. 8 is a sectional view showing a contactor, and a semiconductor wafer mounted on the contactor according to a sixth embodiment of the invention;

FIG. 9 is a flow chart for a description of a method of inspecting a semiconductor device according to a seventh embodiment of the invention;

FIG. 10 is a flow chart for a description of a method of inspecting a semiconductor device according to a eighth embodiment of the invention;

FIG. 11 is a flow chart for a description of a method of inspecting a semiconductor device according to a ninth embodiment of the invention; and FIG. 12 is a fragmental sectional view showing a probing operation in a burn-in test using a conventional contactor.

PREFERRED EMBODIMENT OF THE INVENTION

Preferred embodiments of the invention will be described with reference to the accompanying drawings.

First Embodiment

Figure 1:
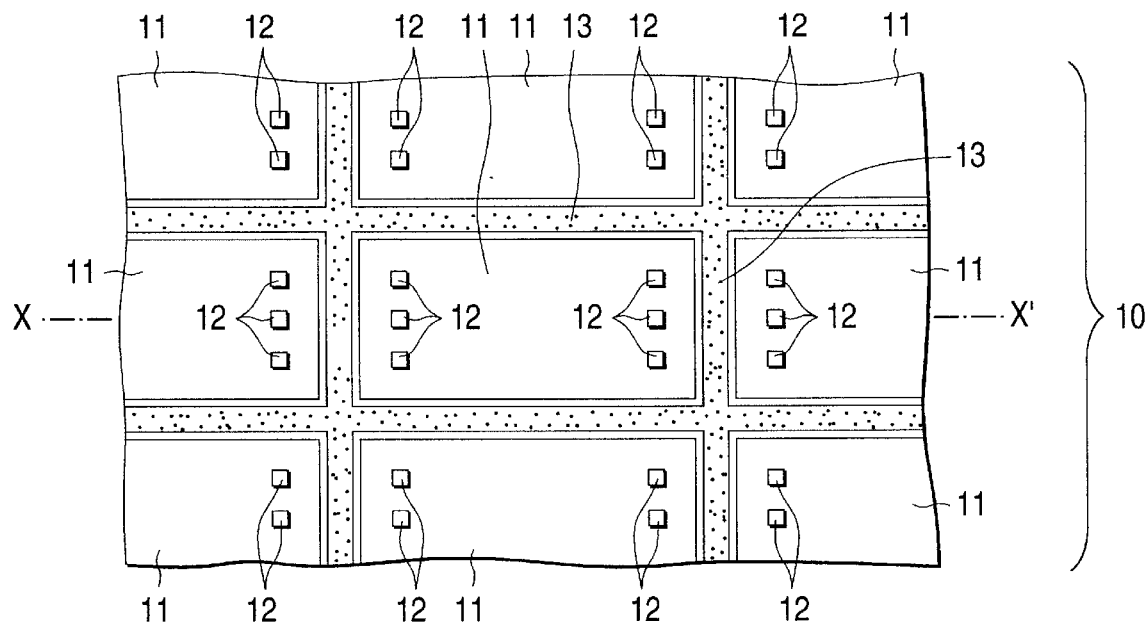
FIG. 1 is a plan view shows a part of a contactor in a first embodiment of the invention.

FIG. 1 is a plan view showing a part of a contactor in a first embodiment of the invention. In FIG. 1, reference numeral 10 designates a contactor; 11, recesses in which semiconductor chips are put; 12, bump electrodes formed on the semiconductor chips which correspond to pad electrodes; and 13, the side walls of the contactor 10 which are formed between adjacent recesses 11 and are trapezoid in section.

Figure 2:
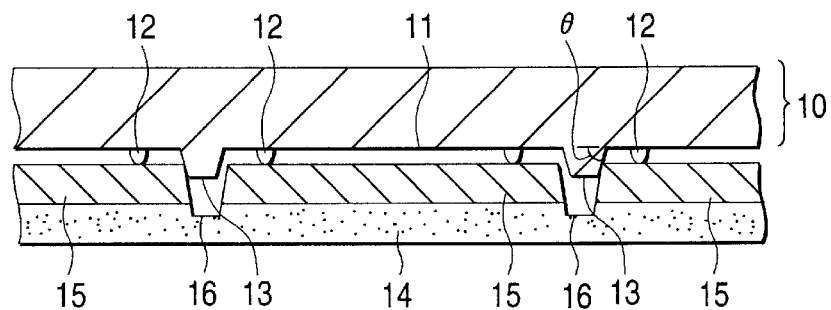
FIG. 2 is a sectional view taken along line X–X' in FIG. 1, showing the contactor and a semiconductor wafer fitted in the contactor in the first embodiment of the invention.

FIG. 2 is a sectional view taken along line X–X' in FIG. 1, showing the contactor and the semiconductor wafer mounted on the latter. In FIG. 2, reference numeral 14 designates a dicing sheet to which the semiconductor wafer is secured; 15, semiconductor chips which are formed in the semiconductor wafer and cut along scribing lines; 16, cut grooves along the scribing lines in which the side walls 13 are fitted; and θ, the angle formed between the bottom and the side surface of each of the side walls 13.

In the first embodiment, by making the angle θ (of the side walls between adjacent recesses 11) smaller than 90°, the width of the end portion of each side wall 13 is decreased. As a result, the side walls 13 of the contactor 10 can be put in the grooves 16 with ease, and the semiconductor chips can be readily fitted in the recesses 11 of the contactor 10. Furthermore, the positions of the pad electrodes and the bump electrodes are automatically determined, and they are accurately brought into contact with each other.

Second Embodiment

Figures 3, 3A:
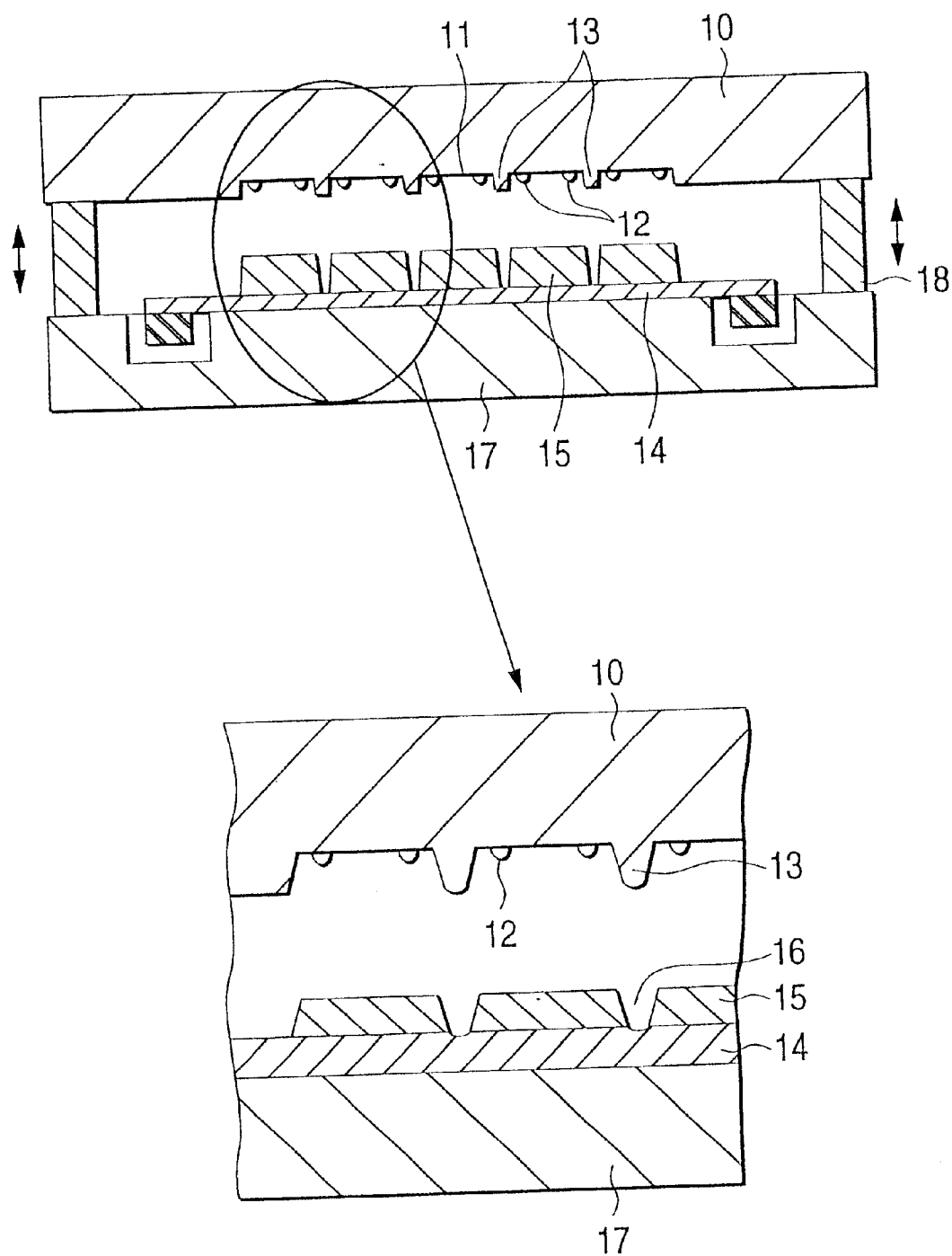
FIG. 3 is a sectional view showing a contactor and semiconductor chips which are going to be fitted in contactor in a second embodiment of the invention.
FIG. 3A is an enlarged view of the highlighted section of FIG. 3.

FIG. 3 is a sectional view of a contactor and semiconductor chips to be fitted therein in a second embodiment of the invention, while FIG. 3A is an enlarged view of the highlighted portion of FIG. 3. In FIGS. 3 and 3A, parts corresponding functionally to those already described with reference to FIG. 2 are therefore designated by the same reference numerals or characters. In FIGS. 3 and 3A, reference numeral 10 designates a contactor; 11, recesses; 12, bump electrodes; 13, side walls; 14, a dicing sheet; 15, semiconductor chips; 16, grooves; 17, a substrate which fixes the semiconductor chips 15 with the aid of the dicing sheet; and 18, springs adapted to push the contactor 10 and the substrate 17 against each other.

FIG. 3 shows a state of the semiconductor chips of the semiconductor devices, which are going to be mounted and pressed. The semiconductor chips of a predetermined size are secured to the dicing sheet 14, and then to the substrate 17 through the dicing sheet 14. The semiconductor chips 15 are fitted in the recesses 11, respectively, in such a manner that the pad electrodes of the semiconductor devices are in alignment with the bump electrodes 12. Thereafter, the contactor 10 and the substrate 15 are pressed against each other so that the bump electrodes 12 are connected to the pad electrodes of the semiconductor chips 15.

Thus, the semiconductor ships 15 are positively mounted on the contactor 10. In the second embodiment, the contact 10 and the substrate 15 are pressed against each by means of the springs; however, the invention is not limited thereto or thereby. That is, a vacuum pressing method or other methods may be employed.

FIG. 4 is a flow chart for a description of a method of inspecting the semiconductor device according to the third embodiment of the invention. The contents of the flow chart will be described with reference to the sectional view of FIG. 2.

First, the semiconductor wafer forming the semiconductor chips is bonded to the dicing sheet 14, which is expandable, and has a thickness of about 100 μm, with an adhesive agent which is such that, when it is irradiated by UV (ultra-violet) rays, its strength of adhesion is decreased, so that the sheet 14 can be removed therefrom. And the dicing sheet 14 around the semiconductor wafer is fixedly bonded to a metal frame with the aforementioned adhesive agent (S1).

Next, with a dicing machine, the semiconductor wafer is cut along the scribing lines to about 100 μm. In this case, the cut grooves 16 of about 10 μm are formed in the dicing sheet 14; however, the latter 14 is not cut into individual pieces. In the case where the dicing sheet 14 is high in electrical resistance, or in electrical insulation, then the semiconductor chips 15 are substantially completely electrically separated from one another. Hence, during the inspection of the semiconductor chips 15, the latter 15 are free from electrical interference with one another (S2).

The semiconductor chips 15 thus separated are set in alignment with the recesses. 11 of the contactor 10, while the scribing line cut grooves 16 are set in alignment with the side walls 13. Under this condition, the pressing operation is carried out (S3).

And, with the contactor, a burn-in test is performed (S4).

Thus, the contact positions (relative positions) of the bump electrodes 12 of the contactor 10, and the pad electrodes of the semiconductor chips 15 are automatically determined. On the other hand, the semiconductor chips 15 are separated from one another. Therefore, even if, at the high-temperature burn-in test, the contactor 10 is thermally expanded, at the periphery of the semiconductor wafer the dicing sheet is expanded according to the recesses 11 of the contactor 10, as a result of which the bump electrodes of the contactor 10 are not shifted in contact position from the pad electrodes of the semiconductor chips.

Fourth Embodiment

FIG. 5 is a flow chart for a description of a method of inspecting a semiconductor device according to a fourth embodiment of the invention. In the fourth embodiment, similarly as in the above-described third embodiment (similarly as in Steps 1 through 4 in FIG. 4) the semiconductor wafer is secured to the dicing sheet 14, and it is completely cut into individual pieces. And the resultant semiconductor chips 15 are fitted in the recesses 11 of the contactor 10, and pressed against the latter. Under this condition, a burn-in test is performed.

Thereafter, the semiconductor-chips 15 are removed from the contactor 10. With semiconductor chips 15 mounted on the dicing sheet 14, a delivery test is carried out to measure the IC characteristic and function characteristic of each semiconductor chip 15 (S5).

It is omitted to give the before shipment test to the semiconductor chip or chips 15 which have been determined unacceptable by the burn-in test results. Therefore, only good semiconductor chips guaranteed in quality can be supplied.

Fifth Embodiment

FIG. 6 is a flow chart for a description of a method of inspecting a semiconductor device according to a fifth embodiment of the invention. The flow chart will be described with reference to the sectional view of FIG. 2.

In advance, it is determined with a semiconductor tester whether or not a semiconductor chip 15 is acceptable (S6). For instance, a semiconductor chip 15 is selected which is bad in supply current is inadequate because of the flow of over-current.

Similarly as in Step S1 in the flow chart of FIG. 4 (describing the third embodiment), the semiconductor wafer is secured to the dicing sheet 14 (S7).

Similarly as in Step S2 in the flow chart of FIG. 4, the semiconductor wafer is completely cut into pieces (S8).

An unacceptable semiconductor chip 15 is removed from the dicing sheet 14 which, when tested with the semiconductor tester (Step S6), is determined unsuitable for the performance of the burn-in test together with other ones (S9)

Thereafter, similarly as in Step S3 in the flow chart of FIG. 4, the semiconductors are fitted in the recesses 11 of the contactor 10, and the former is pressed against the latter (S10).

Under this condition, the burn-in test is carried out (S11).

By performing the above-described processes successively, the unacceptable semiconductor chip or chips are removed before the burn-in test is performed. That is, without interference with voltage or signal by the unacceptable semiconductor chip or chips, the contactor 10 is protected, and voltage or signal can be supplied stably to give the burn-in test to the semiconductor chip or chips 15.

In the above-described embodiment, even if the contactor is thermally expanded at the high-temperature (for instance 125° C.) inspection time of the burn-in test, the thermal expansion will not shift the bump electrodes 12 of the contactor 10 from the pad electrodes of the semiconductor chips 15 in contact position, because the semiconductor chips 15 are separated from one another, and accommodated in their own recesses 11. For instance, in the case of semiconductor chips of 10 mm×10 mm, the semiconductor chip of silicon expands about 3.5 $\mu$m, and the contactor of polyimide expands about 16 $\mu$m; that is, the difference between them is only about 13 $\mu$m. The bump electrodes of the contactor 10 are not shifted from the pad electrodes of the semiconductor chips.

Sixth Embodiment

FIG. 7 is a plan view showing a part of the contactor in the sixth embodiment of the invention. The contactor shown in FIG. 7 is equal in structure to that which is shown in FIG. 1 except the configuration of the side walls 13 and the configuration of the recesses.

FIG. 8 is a sectional view showing the contactor, and a semiconductor wafer mounted on the contactor. In FIG. 8, parts corresponding functionally to those already described with reference to FIG. 2 (the first embodiment) are therefore designated by the same reference numerals or characters. In the sixth embodiment, grooves 16a are formed in the semiconductor wafer bonded to an expandable dicing sheet 14 has grooves 16a according to the size of semiconductor chips 15 in such a manner that those grooves 16a are extended along scribing lines and have a depth which is about half of the thickness of the semiconductor wafer. That is, in the sixth embodiment, the semiconductor wafer is not completely cut—leaving about 50% of the thickness.

According to sixth embodiment of the present invention, the depth of the groove 16 is not limited to 50% of the thickness of the semiconductor wafer. If the wafer is not cut off, the depth of the grooves may be deeper or shallower than 50% of the semiconductor wafer.

A contactor 10 is made of a material which is substantially equal in thermal expansion coefficient to the semiconductor substrate. More specifically, it is desirable that the material is such that, at the temperature raise of 100° C., the difference of expansion of the periphery of a 12-inch semiconductor substrate is within 50 $\mu$m. In addition, the contactor may be formed with the same material as the semiconductor substrate.

In the sixth embodiment, when side walls 13 are fitted in the grooves 16a, the positions of the pad electrodes of the semiconductor chips 15 and those of the bump electrodes 12 of the contactor 10 are automatically determined; that is, the former are brought into contact with the latter with high accuracy. The contactor is formed with the material which is substantially equal in thermal expansion coefficient to the material of the semiconductor substrate. Hence, at the time of high temperature, the pad electrodes will never be shifted from the bump electrodes by the thermal expansion.

In the sixth embodiment, the semiconductor wafer is not completely cut. Hence, even after the burn-in test, it can be handled as a semiconductor wafer.

Seventh Embodiment

FIG. 9 is a flow chart for a description of inspecting a semiconductor device according to a seventh embodiment of the invention. The flow chart will be described with reference to the sectional view of FIG. 8.

Similarly as in the third embodiment shown in FIG. 4, the semiconductor wafer forming the semiconductor chips 15 is bonded to the dicing sheet 14, which is expandable, and has a thickness of about 100 $\mu$m, with an adhesive agent which is such that, when it is irradiated by UV (ultra-violet) rays, its strength of adhesion is decreased, so that the sheet 14 can be removed therefrom. And the dicing sheet 14 around the semiconductor wafer is fixedly bonded to a metal frame with the aforementioned adhesive agent (S21).

Next, with a dicing machine, the semiconductor wafer is cut along the scribing lines to about half of the thickness of the semiconductor wafer; that is, grooves are formed (S22).

The semiconductor chips 15 are set in alignment with the recesses 11 of the contactor 10, while the grooves 16 are set in alignment with the side walls 13. Under this condition, the pressing operation is carried out (S23).

And, the contactor which is formed with the material which is equal in thermal expansion coefficient to the material of the semiconductor substrate is used to perform a burn-in test (S24).

Thus, the contact positions (relative positions) of the bump electrodes 12 of the contactor 10 and those of the pad electrodes of the semiconductor chips 15 are automatically determined. Furthermore, since the contactor 10 is made of the material which is substantially equal in thermal expansion coefficient to the material of the semiconductor substrate, even at the high-temperature burn-in test the bump electrodes 12 of the contactor 10 will not be shifted from the pad electrodes of the semiconductor chips.

Eighth Embodiment

FIG. 10 is a flow chart for a description of a method of inspecting of a semiconductor device according to an eighth embodiment of the invention. The inspecting method according to the eighth embodiment is substantially similarly to the case of the inspecting method according to the seventh embodiment. That is, as in Steps 1 through 4 in the flow chart of FIG. 9, a semiconductor wafer is secured to a dicing sheet 14, grooves are formed in the semiconductor wafer, and the semiconductor chips are fitted in the recesses 11 of the contactor 10, and then subjected to a pressing operation. Thereafter, the burn-in test is carried out.

Under this condition, the semiconductor chips 15 are removed from the contactor 10. And under the condition that the semiconductor chips 15 are mounted on the dicing sheet, a delivery inspection is carried out to measure the IC characteristic and function characteristic of the semiconductor chips 15 (S25).

It is omitted to give the before shipment test to the semiconductor chip or chips 15 which have been determined unacceptable by the burn-in test results. Therefore, only good semiconductor chips guaranteed in quality can be supplied.

After the burn-in test, the semiconductor wafer may be subjected to dicing to form semiconductor chips, so that the semiconductor chips are subjected individually to the delivery inspection.

Ninth Embodiment

FIG. 11 is a flow chart for a description of a method of inspecting a semiconductor device according to a ninth embodiment of the invention. The flow chart will be described with reference to the sectional view of FIG. 8.

In advance, a semiconductor test is used to determine whether or not semiconductor chips are acceptable. For instance, in the case where the flow of over-current is detected, so that the supply current is inadequate, it is determined that the semiconductor chip is unacceptable (S26).

Similarly as in Step S1 in the flow chart of FIG. 9 (the seventh embodiment), the semiconductor wafer is secured to the dicing sheet 14 (S27).

Similarly as in Step S2 in the flow chart of FIG. 4, grooves are formed in the semiconductor wafer along scribing lines (S28).

In the case where, as a result of the test done with the semiconductor test, some of the semiconductor chips are so determined that, for instance because of inadequate supply current, it is not suitable to subject them to the burn-in test together with the remaining. The unacceptable semiconductor chips thus detected are insulated, for instance, by application of insulating paint (S29).

Thereafter, similarly as in Step S23 in the flow chart of FIG. 9, the semiconductor chips are fitted in the recesses 11 of the contactor 10, and then pressed (S30).

In the last step, the burn-in test is carried out (S31).

The above-described steps are carried out successively. Therefore, before the burn-in test is performed, the unacceptable semiconductor chips are insulated from the acceptable ones. Hence, without interference with voltage or signal by the unacceptable semiconductor chips, the contactor 10 is protected, and voltage or signal can be supplied stably to give the burn-in test to the semiconductor chip or chips 15.

Tenth Embodiment

In the above-described embodiments, the side walls correspond in configuration to the semiconductor chips; however, the invention is not limited thereto or thereby. That is, as shown in FIG. 7, the side walls may be provided at four corners of each of the semiconductor chips, with the recesses being continuous with ones adjacent thereto.

In this case, the side walls may be in the form of a cross as shown in FIG. 7, or may be replaced with four end points which may be connected crosswise. That is, the side walls may be freely changed or modified as long as they fixedly secure the semiconductor chips.

As is apparent from the above description, in the invention, the recesses are formed in the contactor which are equal in size to the semiconductor chips. Therefore, the bump electrodes of the contactors, and the pad electrodes of the semiconductor chips are automatically positioned.

With the aid of the substrate to which the semiconductor chips are secured, and the contactor pressing means, the bump electrodes are positively brought into contact with the pad electrodes.

Each side wall formed between adjacent recesses is trapezoid in section. This feature makes it ready to fit the semiconductor chips in the recesses.

At the high-temperature burn-in test, the semiconductor chips which has been completely cut (separated from one another) are fixed to the dicing sheet. Hence, the thermal expansion of the contactor is divided into amounts each of which corresponds to the size of the semiconductor chips thus separated, and is covered by the elongation of the dicing sheet; that is, the bump electrodes will never be shifted from the pad electrodes.

The semiconductor chips which have been determined unacceptable by the burn-in test, are discarded; that is, only the acceptable semiconductor chips can be supplied.

Before the burn-in test is carried out, it is determined whether or not the semiconductor chips are acceptable, and the unacceptable semiconductor chips are discharged. Hence, the contactor is protected, and voltage or signal can be stably supplied. This means that the burn-in test is improved in reliability.

Furthermore, the contactor may be made of the material which is substantially equal in thermal expansion coefficient to the material of the semiconductor substrate. If, in this case, the semiconductor wafer is not completely cut (not completely separated from one another), and grooves are formed along the semiconductor chip scribing lines, the effects of the invention can be obtained in the same way.

What is claimed is:

1. semiconductor device inspecting method comprising the steps of:
   a first step of fixing a semiconductor wafer having a plurality of semiconductor chips on an expandable dicing sheet;
   a second step of completely cutting said semiconductor wafer together with part of said dicing sheet, to separate said semiconductor chips from one another;
   a third step of aligning a plurality of bump electrodes provided in recesses formed in a contactor with pad electrodes on said semiconductor chips, and pressing said bump electrodes against said pad electrodes so that said bump electrodes are electrically connected to said pad electrodes, respectively; and
   a fourth step of performing a burn-in test.

2. A semiconductor device inspecting method as claimed in claim 1, further comprising:
   a step of giving a delivery inspection to said semiconductor chips after said fourth step.

3. A semiconductor device inspecting method as claimed in claim 2, further comprising the steps of:
   before said third step of mounting said semiconductor chips on said contactor, a step of determining whether or not said semiconductor chips are acceptable, and
   a step of removing any one of said semiconductor chips which has been determined unacceptable are carried out.

4. A semiconductor device inspecting method comprising the steps of:
- a first step of fixing a semiconductor wafer having a plurality of semiconductor chips on an expandable dicing sheet;
- a second step of forming grooves in a semiconductor wafer along scribing lines of semiconductor chips;
- a third step of aligning a plurality of bump electrodes provided in recesses formed in a contactor which is made of a material which is substantially equal in thermal expansion coefficient to a semiconductor substrate with pad electrodes on said semiconductor chips, and pressing said bump electrodes against said pad electrodes so that said bump electrodes are electrically connected to said pad electrodes, respectively; and
- a fourth step of performing a burn-in test.

5. A semiconductor device inspecting method as claimed in claim 4, further comprising:
- a step of giving a delivery inspection to said semiconductor chips after said fourth step of performing said burn-in test.

6. A semiconductor device inspecting method as claimed in claim 4, further comprising the steps of:
- before said third step of mounting said semiconductor chips on said contactor, a step of determining whether or not said semiconductor chips are acceptable, and
- a step of insulating any one of said semiconductor chips which has been determined unacceptable are carried out.

* * * * *

UNITED STATES PATENT AND TRADEMARK OFFICE
CERTIFICATE OF CORRECTION

PATENT NO. : 6,340,604 B1
DATED : January 22, 2002
INVENTOR(S) : Tsuura

It is certified that error appears in the above-identified patent and that said Letters Patent is hereby corrected as shown below:

<u>Column 10,</u>
Line 40, before "semiconductor", please insert -- A --.

Signed and Sealed this

Third Day of September, 2002

Attest:

JAMES E. ROGAN
Attesting Officer  *Director of the United States Patent and Trademark Office*